United States Patent
Wang et al.

[11] Patent Number: 6,124,200
[45] Date of Patent: Sep. 26, 2000

[54] METHOD OF FABRICATING AN UNLANDED VIA

[75] Inventors: Chih-Jung Wang; Lu-Min Liu, both of Hsinchu, Taiwan

[73] Assignee: UTEK Semiconductor Corp, Hsinchu, Taiwan

[21] Appl. No.: 09/359,449

[22] Filed: Jul. 22, 1999

[51] Int. Cl.[7] .............................................. H01L 21/4763
[52] U.S. Cl. ..................... 438/624; 438/634; 438/636; 438/637
[58] Field of Search ..................................... 438/622, 623, 438/624, 631, 633, 634, 636, 637; 257/758, 759, 760

[56] References Cited

U.S. PATENT DOCUMENTS

| | | | |
|---|---|---|---|
| 5,451,543 | 9/1995 | Woo et al. | 438/622 |
| 5,470,793 | 11/1995 | Kalnitsky | 438/624 |
| 5,482,900 | 1/1996 | Yang | 438/624 |
| 5,702,981 | 12/1997 | Maniar et al. | 438/624 |
| 5,708,303 | 1/1998 | Jeng | 257/758 |
| 5,792,705 | 8/1998 | Wang et al. | 438/624 |
| 5,858,870 | 1/1999 | Zheng et al. | 438/622 |
| 5,858,875 | 1/1999 | Chung et al. | 438/634 |
| 5,935,868 | 8/1999 | Fang et al. | 438/692 |
| 5,960,316 | 9/1999 | Bai | 438/633 |

*Primary Examiner*—T. N. Quach
*Attorney, Agent, or Firm*—J.C. Patents; Jiawei Huang

[57] ABSTRACT

A method of fabricating an unlanded via. A substrate has a metal layer formed thereon and an ARC layer is formed on the metal layer. A liner dielectric layer is formed on the ARC layer and the sidewall of the metal layer, and an insulating material layer is formed on the insulating dielectric layer. The insulating material layer is then etched back, so a surface of the insulating material layer lower than the ARC layer surface is formed. Thereafter, a protective layer is formed on the insulating material layer and the metal layer, in which the protective layer is different from the liner dielectric layer. An IMD layer is formed on the protective layer. Using the liner dielectric layer as an etching stop layer, the IMD layer and the protective layer are patterned, and then the liner dielectric layer on the metal layer is removed, such that an unlanded via opening is formed.

20 Claims, 8 Drawing Sheets

METHOD OF FABRICATING AN UNLANDED VIA

BACKGROUND OF THE INVENTION

1. Field of Invention

The present invention relates to fabrication of via in semiconductor device. More particularly, the present invention relates to a method of fabricating an unlanded via.

2. Description of Related Art

As the size of the semiconductor device is gradually reduced, the chances of misalignment during photolithography are increased. When misalignment occurs during via formation, the dielectric layer adjacent to the metal layer is easily overetched.

Figure 1A:
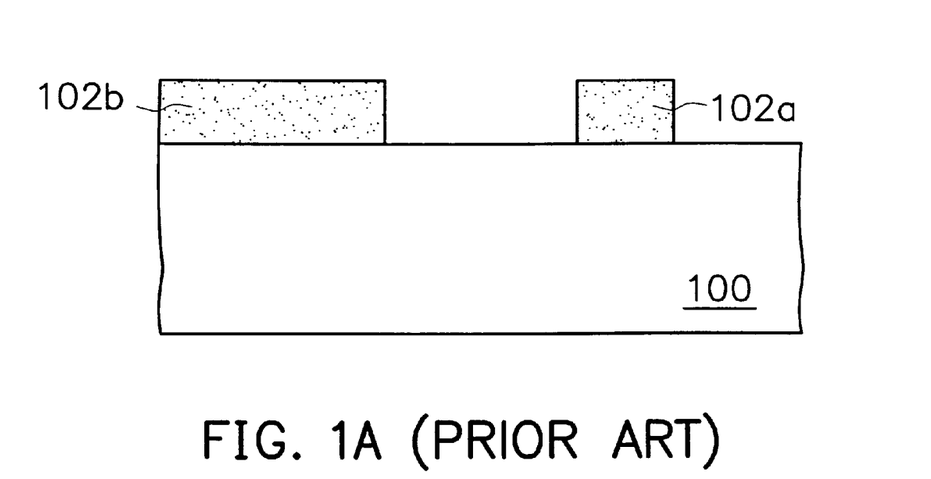
FIGS. 1A–1D are schematic, cross-sectional views illustrating fabrication of an unlanded via in the prior art.
Figure 1B:
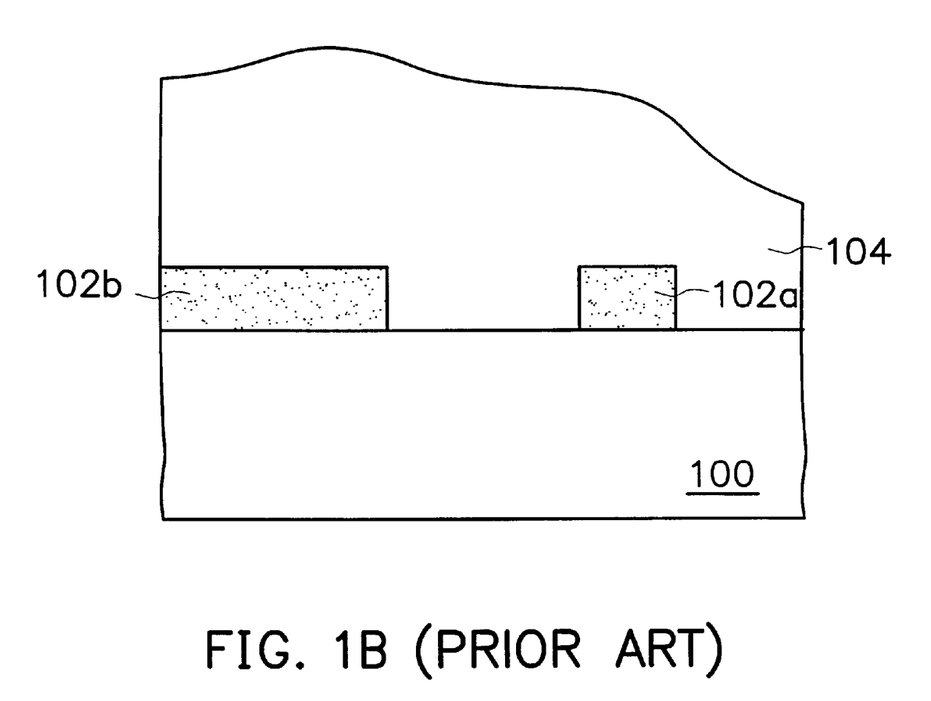

Referring to FIG. 1A, patterned metal layers 102a, 102b are formed on a substrate 100. As shown in FIG. 1B, an inter-metal dielectric layer (IMD) 104 is formed over the substrate 100 to cover the metal layers 102a, 102b. The IMD layer 104 has an uneven topography due to the metal layers 102a, 102b. Thereafter, chemical mechanical polishing (CMP) is performed to planarize the IMD layer 104.

Figure 1C:
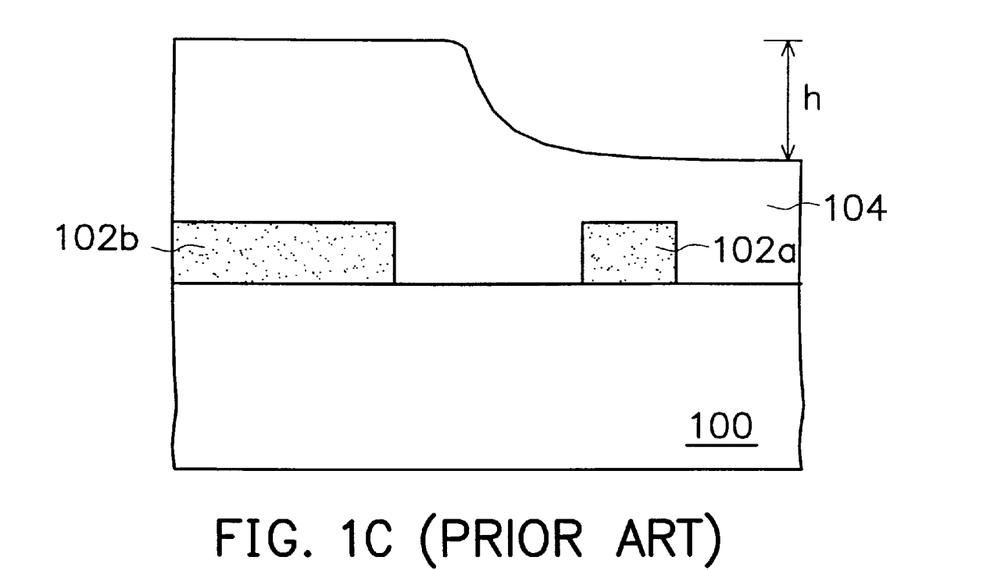

The metal layers 102a, 102b with small area and large area, respectively, are simultaneously formed on a single wafer. The metal layers 102a, 102b usually belong to dense pattern and less dense pattern, respectively. Accordingly, when CMP in the forgoing process is carried out, a thickness difference 'h' of the IMD layer 104 over the metal layer 102a, 102b is created due to the polishing characteristic of CMP, as illustrated in FIG. 1C. As a result, the difference 'h' of the IMD layer 104 thickness is about 2000 angstroms.

Figure 1D:
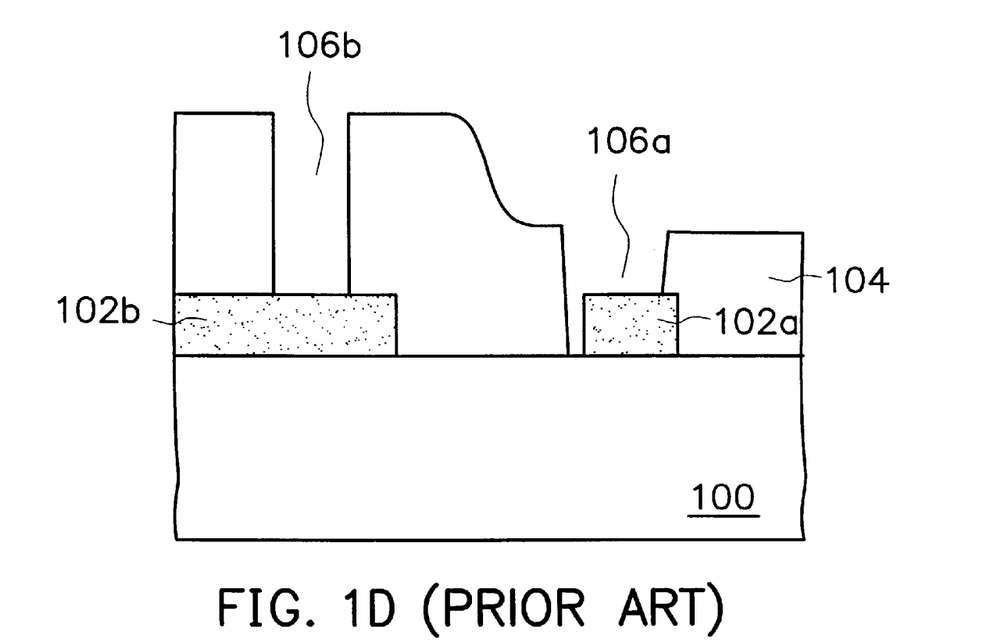

The IMD layer 104 is then patterned and unlanded via openings 106a, 106b are respectively formed on the metal layer 102a, 102b, as shown in FIG. 1D. In order to completely expose the metal layer 102b so as to create a good contact between the metal and the via, the IMD layer 104 with a thicker thickness has to be over-etched when forming the via opening 106b. As a result, this over-etching process causes serious over-etching of the IMD layer 104 on and adjacent to the metal layer 102a when forming an unlanded via opening 106a within the thinner IMD layer 104. The most serious problem is the IMD layer 104 being over-etched to expose the sidewall 108 of the metal layer 102a and the substrate 100 underlying the IMD layer 104. When metal material is deposited in the unlanded via openings 106a, 106b to form vias, the over-etching of the IMD layer 104 on the metal 102a induces problems such as an increase of RC resistance.

SUMMARY OF THE INVENTION

The invention provides a method of fabricating an unlanded via. A metal layer is formed on a substrate and an ARC layer is formed on the metal layer. A liner dielectric layer is formed on the sidewall of the metal layer and the ARC layer. An insulating material layer is formed over the liner dielectric layer. The insulating material layer is then etched back to expose the liner dielectric layer in which the insulating material layer has a lower surface than the ARC layer. Thereafter, a planarized protective layer is formed on the insulating material layer and the metal layer wherein the insulating material layer is different from the liner dielectric layer. An IMD layer is formed on the protective layer. The IMD layer and the liner dielectric layer are patterned using the liner layer as an etching stop layer, such that a portion of the liner dielectric layer is exposed. The exposed liner dielectric layer on the metal layer is then removed, and as a result, an unlanded via opening is formed.

The invention further provides a method of fabricating an unlanded via. Wiring lines are formed on a substrate and separated by gaps. An ARC layer is then formed on the wiring lines. An insulating material layer is formed to fill in the gaps so that the top surface of the insulating material layer has to be lower than that of the ARC layer on the wiring lines. A protective layer is formed on the insulating material layer, and the top surface of the protective layer on the insulating material layer is at least higher than that of the ARC layer. An IMD layer is formed on the protective layer and the wiring lines. The IMD layer is then patterned as to form an unlanded via opening.

The invention also provides a method of fabricating an unlanded via. An ARC layer is formed on a substrate having a first metal layer and a second metal layer. A conformal liner dielectric layer is formed on the substrate, and an insulating material layer is formed on the conformal liner dielectric layer. After etching back the insulating material layer, the conformal liner dielectric layer on the first metal layer is exposed and a portion of the insulating material remains on the second metal layer. A protective layer is formed on the insulating material layer, the first and the second metal layers. A portion of the insulating material layer and the protective layer on the second metal layer are removed, and a planarization step is then performed on the protective layer. An IMD layer is formed over the protective layer, the first and second metal layers. The IMD layer is then patterned, such that an unlanded via opening is formed on the first metal layer and a landed via opening is formed on the second via opening.

As embodied and broadly described herein, the invention provides a liner dielectric layer on the metal layer, which is used as an etching stop layer. Since the liner dielectric layer on the sidewall of the metal layer is relatively thicker and in addition the protective layer between the metal layers is thicker than that on the metal layer, the over-etching of the liner dielectric layer beside the metal layer is retarded when the process of forming an unlanded via opening is performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In order to overcome the difficulties caused by over-etching in the dielectric layer adjacent to the unlanded via, the embodiment of the invention provides a liner dielectric layer on the metal pattern, in which embodiment the liner dielectric layer is used as an etching stop layer when forming an unlanded via opening. The liner dielectric layer on the sidewall of the metal pattern is thicker than that on the metal pattern, so that the over-etching in the dielectric layer beside the metal pattern is reduced.

The embodiment of the invention forms a liner dielectric layer on the top and the sidewall of the wiring lines wherein the wiring lines have an ARC layer formed thereon. The steps of deposition and etching back are successively performed to form an insulating material layer in the gaps, which separate the wiring lines. The top surface of the insulating material layer must be lower than the ARC layer. A protective layer is deposited over the substrate to cover the liner dielectric layer and the insulating material layer. Thereafter, CMP is performed to planarize the protective layer. Since the top surface of the insulating material layer is lower than that of the ARC layer, the protective layer on the insulating material layer is thicker than that on the wiring lines. An IMD layer is then formed on the protective layer. The IMD layer and the protective layer are patterned and etched by photolithography, and the etching process stops on the liner dielectric layer above the ARC layer. The exposed liner dielectric layer is removed to expose the ARC layer. An unlanded via opening is formed due to misalignment.

When the insulating material layer is etched back in the forgoing process, a portion of the insulating material layer sometimes remains on a portion of the wiring lines, which insulating material layer portion easily causes the difficulties when etching a via opening in subsequent process. Therefore, when the insulating material layer is left on the wiring lines, the protective layer and the insulating material layer above such wiring lines have to be removed by photolithography after depositing the protective layer before polishing the protective layer. Accordingly, an opening is formed above such wiring lines. Thereafter, the planarization of the protective layer and other subsequent process are then carried out. Since the protective layer and the insulating material layer above the wiring lines are partially removed, the etching process to form a via opening is smoothly performed.

Figure 2A:
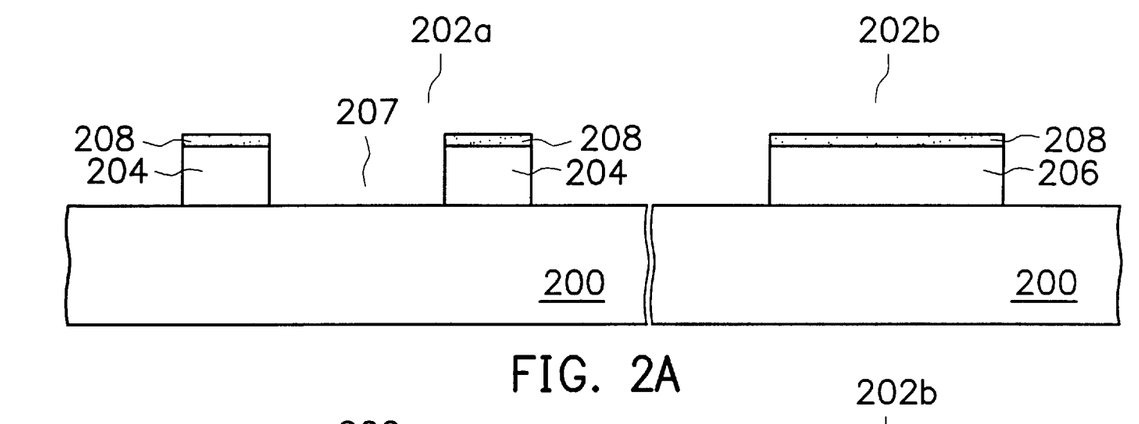
FIGS. 2A–2H are schematic, cross-sectional views illustrating fabrication of an unlanded via according to one preferred embodiment of this invention.

FIGS. 2A–2H shows fabrication of an unlanded via according to the preferred embodiment of the invention. Referring to FIG. 2A, a metal pattern 202a with metal layer 204 and a metal pattern 202b with metal layer 206 are formed on a substrate 200 of a single wafer. Generally, the area of the metal layer 204 in the metal pattern 202a is smaller than that of the metal layer 206 in the metal pattern 202b. The metal layers 204, 206 are used as wiring lines, for example, and separated from one another by gaps 207. The metal layers 204, 206 have an anti-reflective coating layer (ARC) layer formed thereon, and can be made of silicon nitride with a thickness of about 500–1000 angstroms, for example.

Figure 2B:
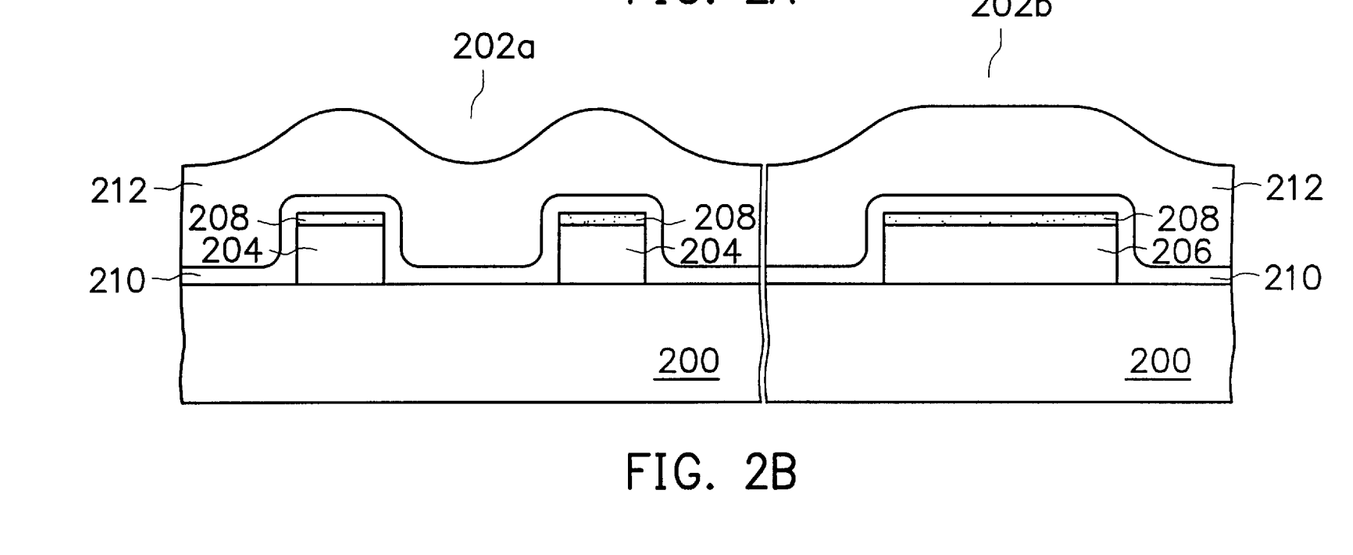

As shown in FIG. 2B, a conformal liner dielectric layer 210 is formed over the substrate 200 to cover the top and the sidewall of the ARC layer 208 and the metal layers 204, 206. The conformal dielectric layer 210 can be formed by CVD with a thickness of about 2000 angstroms, for example. An insulating material layer 212 such as spin-on-glass (SOG) is then formed on the liner dielectric layer 210 to fill in the gaps (FIG. 2A) and cover the liner dielectric layer 210. The formation of the liner dielectric layer 210 is disposed between the insulating material layer 212 and the metal layers 204, 206 to prevent degassing of SOG and to improve adhesion.

Figure 2C:
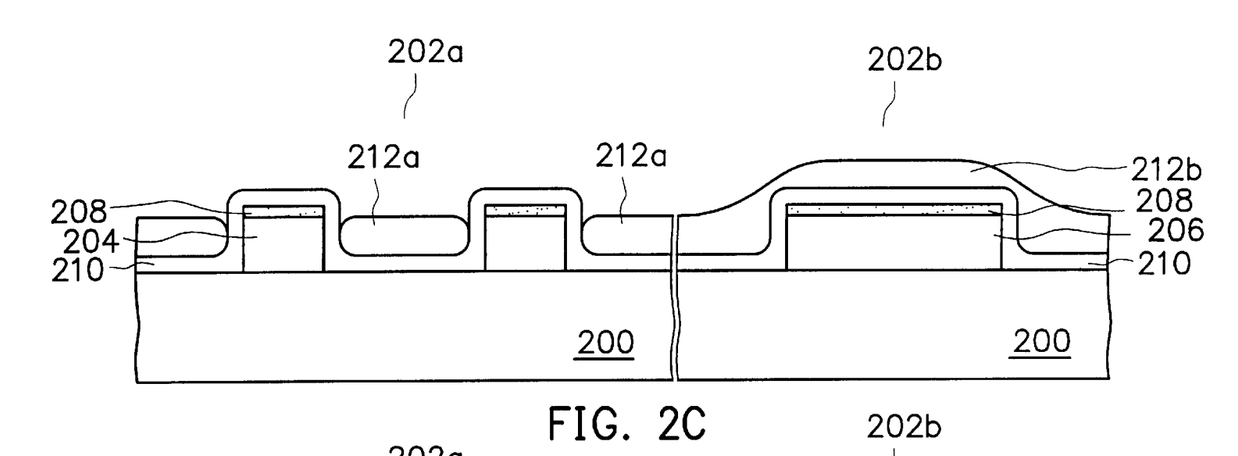

The insulating material layer 212 is then etched back to remove the insulating material layer 212 above the metal layers 204, 206, so that the top surface of the insulating material layer 212a cannot be higher than that of the ARC layer 208, that is, the insulating material layer 212a surface is lower than the ARC layer 208 surface. Accordingly, the insulating material layer 212a only fills in the gaps 207 (FIG. 2A) to at least expose the liner dielectric layer 210 on the metal layer 204 in the metal pattern 202a, as shown in FIG. 2C.

Alternatively, the liner dielectric layer 210 on the metal layer 204 may be removed during etching back as to expose the ARC layer 208. However, when the insulating material layer 212 in the metal pattern 202a is completely removed, the metal pattern 202b has the insulating material layer 212b left on the metal layer 206. If the additional insulating material layer 212b in the metal pattern 202b is completely removed, the insulating material layer 212 and the ARC layer 208 in the metal pattern 202a must be over-etched, which leads to damage of the metal layer 204. Therefore, since even the metal layer 206 has the insulating material layer 212b remaining in the metal pattern 202b, the etching back step does not continue.

Figure 2D:
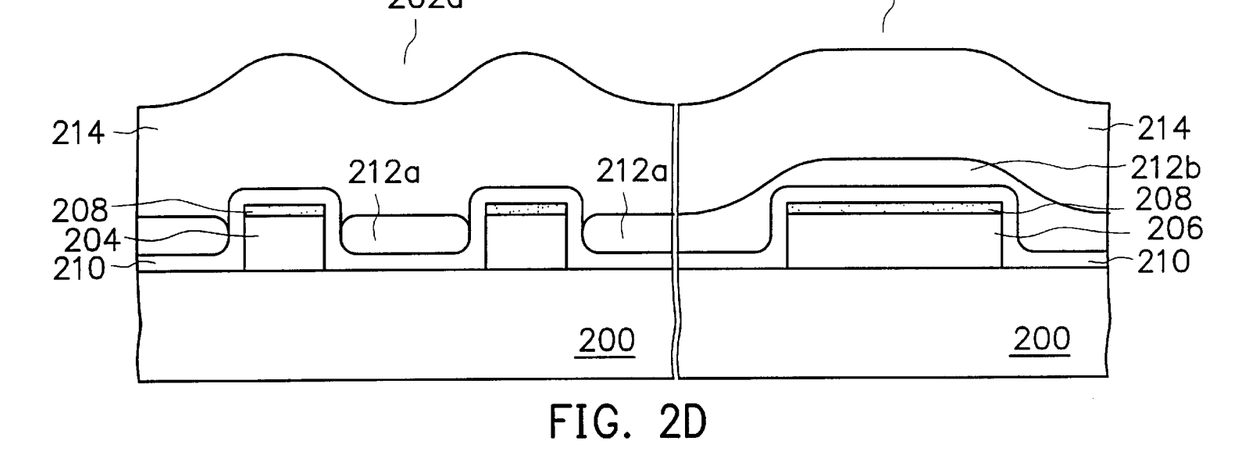
Figure 2E:
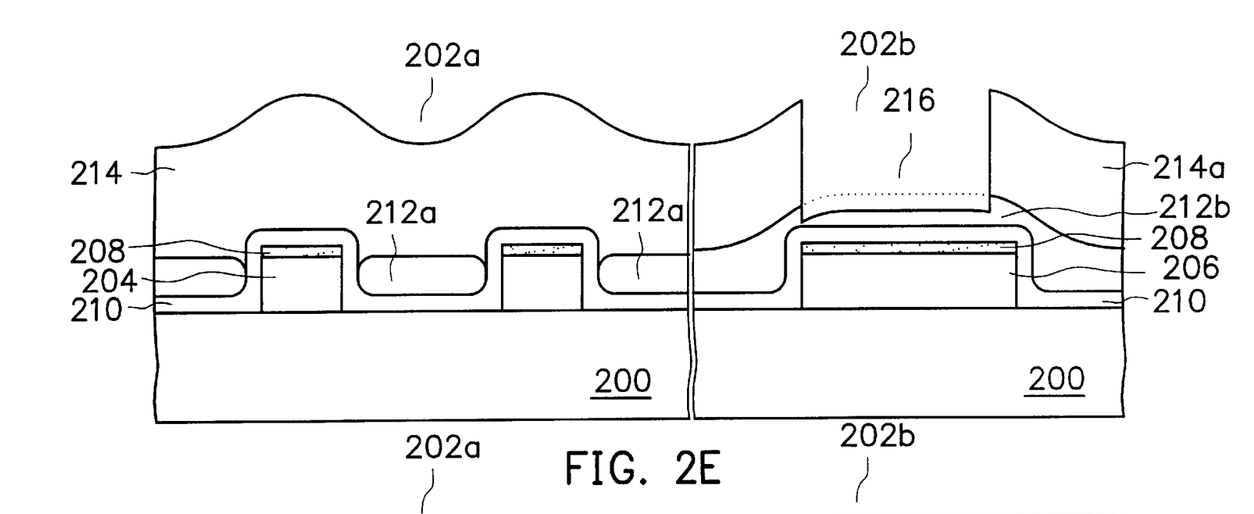

Referring to FIG. 2D, a protective layer 214 is formed over the metal layer 204, the ARC layer 208 and the insulating material layers 212a, 212b. The protective layer 214 has to have a different etching rate from the liner dielectric layer 210. The protective layer 214 can be silicon oxide or silicon-oxy-nitride and formed by CVD, for example. Thereafter, to prevent the residue of the insulating material layer 212b on the metal layer 206 from causing incomplete exposure of the metal layer 206 in the metal pattern 202b, as occurs when the insulating material layer 212b is left on the metal layer 206, the protective layer 214 and the insulating material layer 212b above the metal layer 206 are removed by photolithography. While using a mask to cover the metal pattern 202a, an opening 216 is formed in the protective layer 214a and the insulating material layer 212b above the metal layer 206, as shown in FIG. 2E. Accordingly, most of the protective layer 214 and the insulating material layer 212b above the metal layer 206 are removed to expose the insulating material layer 212b. Alternatively, the protective layer 214 and the insulating material layer 212b above the metal layer 206 can be completely removed to expose the liner dielectric layer 210.

Figure 2F:
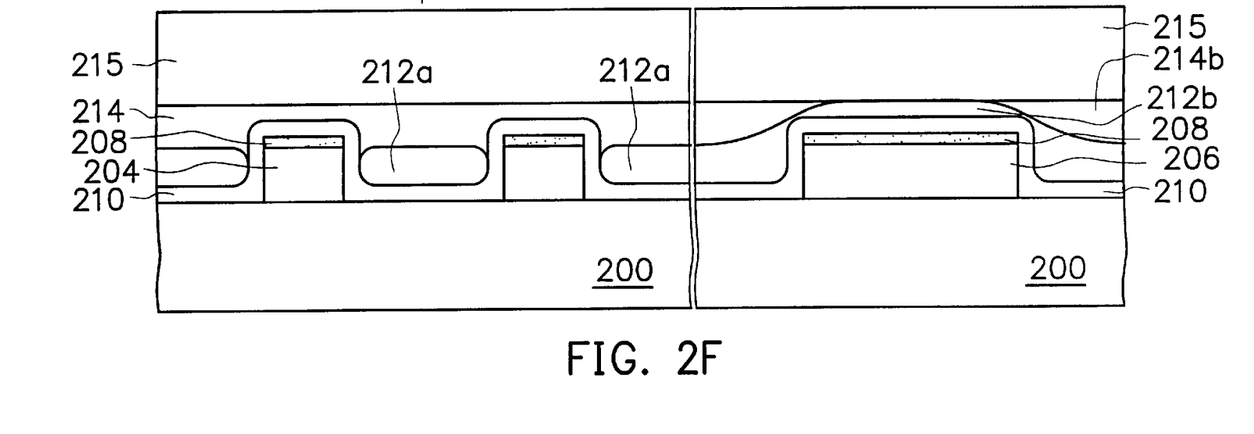

A planarization step is then performed on the protective layer 214,214a above the metal layers 204, 206, as shown in FIG. 2F, to remove the protective layer 214, 214b. Such planarization step can be performed by CMP, for example. Since the protective layer 214b on the metal layer 206 is almost removed in the forgoing process, the protective layer 214b on the metal layer 206 can be completely removed when CMP is performed, but remains on the metal layer 204. Alternatively, CMP is performed until the liner dielectric layer 210 is exposed, but the protective layer 214 still remains on the insulating material layer 212a. An IMD layer 215 is then formed on the protective layer 214, 214a.

Figure 2G:
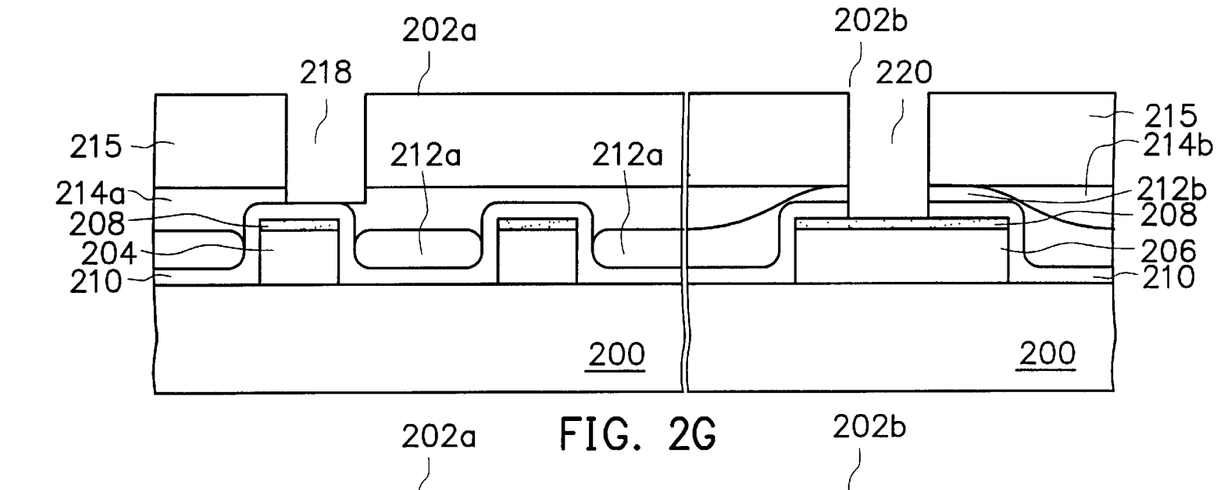

Referring to FIG. 2G, the IMD layer 215 is then patterned by a photolithography and etching process. The etching process is isotropically performed to successively etch the IMD layer 215 and the protective layer 214a using the liner dielectric layer 210 as an etching stop layer, such that an opening 218 is formed to expose the liner dielectric layer 210. Due to misalignment during photolithography, only a portion of the opening 218 is located above the metal layer 204 and a portion of the opening 218 is disposed above the insulating material layer 212a and the liner dielectric layer 210 adjacent to the metal layer 204. In addition, the forgoing photolithography also forms an opening 220 within the IMD layer 215 and the insulating material layer 212b to expose the ARC layer.

Figure 2H:
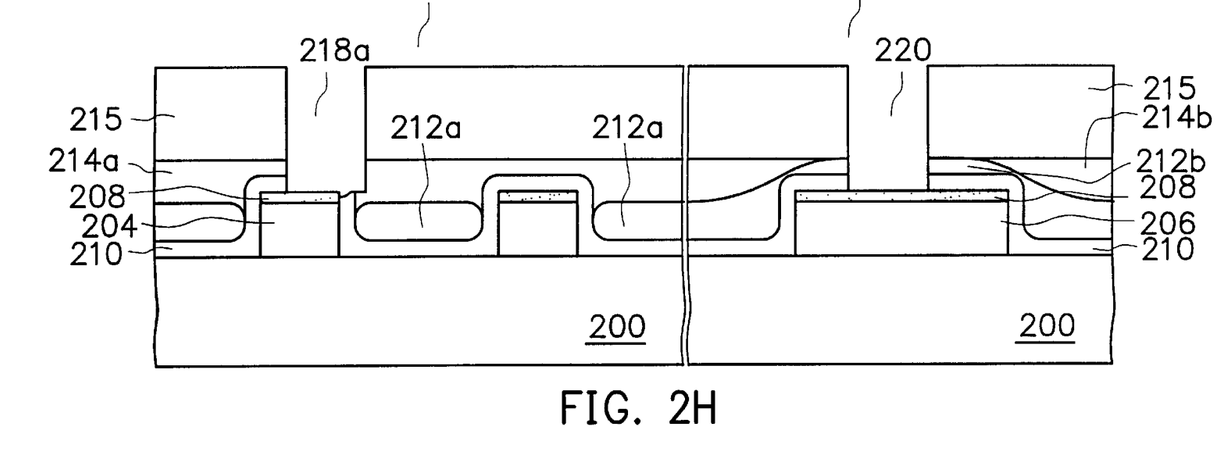

As shown in FIG. 2H, the exposed liner dielectric layer 210 is then removed to expose the ARC layer 208 on the metal layer 204, such that an unlanded via opening 218a is formed. The liner dielectric layer 210 adjacent to the metal layer 204 is thicker than the liner dielectric layer 210 on the top of the metal layer 204. In addition, the width of the liner dielectric layer 210 adjacent to the metal layer 204 is thin, such that the formation of the liner dielectric layer 210 and the protective layer 214 can protect the metal layer 204 and the insulating material layer 212a from being over-etched. Accordingly, the problems in subsequent process or increased RC resistance caused by over-etching can be overcome. On the other hand, since the metal layer 206 has a larger area, misalignments seldom occurs, such that a landed via opening 220 is formed.

Figure 3A:
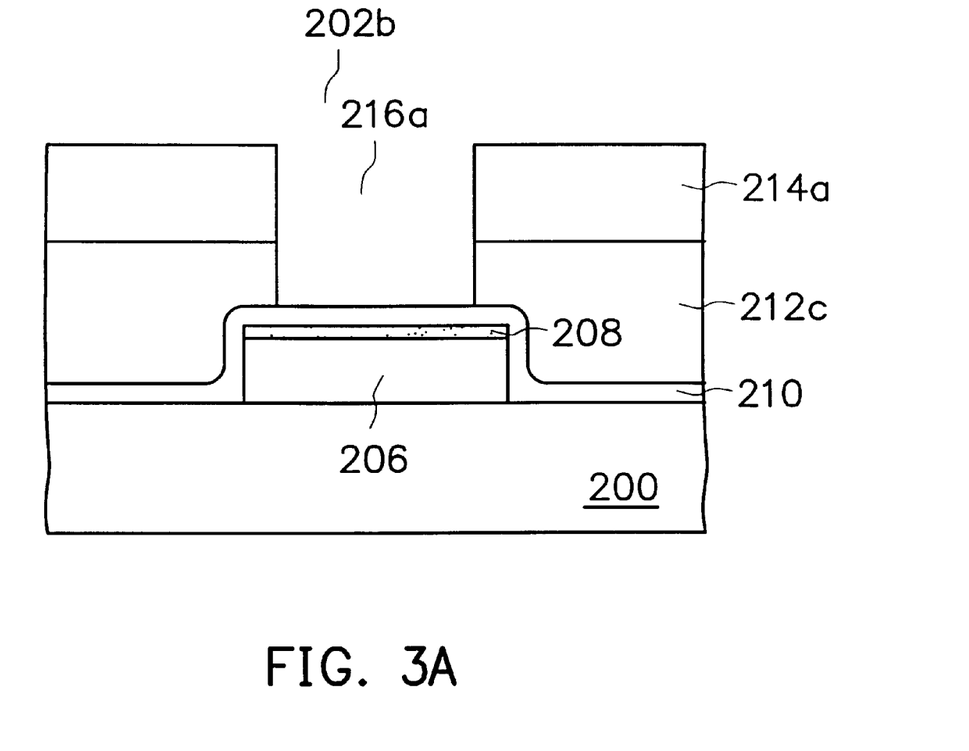
FIGS. 3A–3D are schematic, cross-sectional views illustrating fabrication of a landed via according to one preferred embodiment of this invention.
Figure 3B:
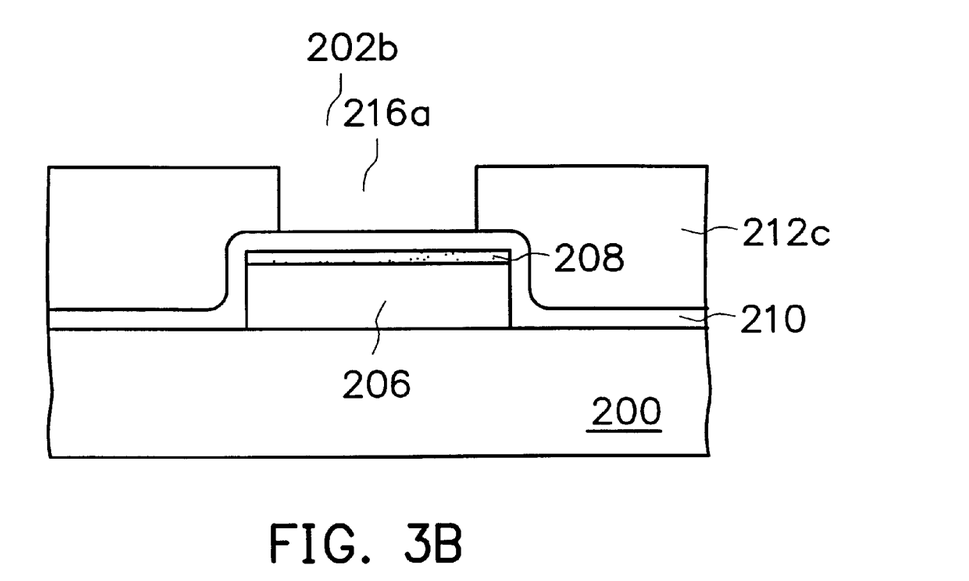

Moreover, the opening 216 as shown in FIG. 2E can be illustrated as the opening 216a in FIG. 3A in the process of the metal pattern 202b. The protective layer 214a and the insulating material layer 212c above the metal layer 206 can be completely removed to expose the liner dielectric layer 210. Thereafter, the planarization and the removal of the protective layer 214a are performed to expose the insulating material layer 212c, as shown in FIG. 3B.

Figure 3C:
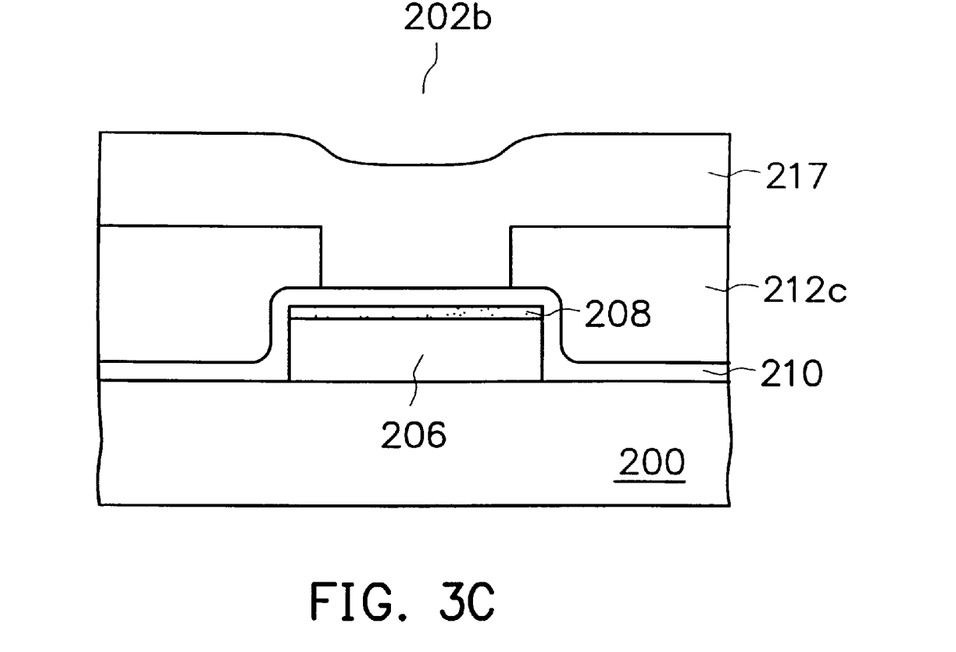
Figure 3D:
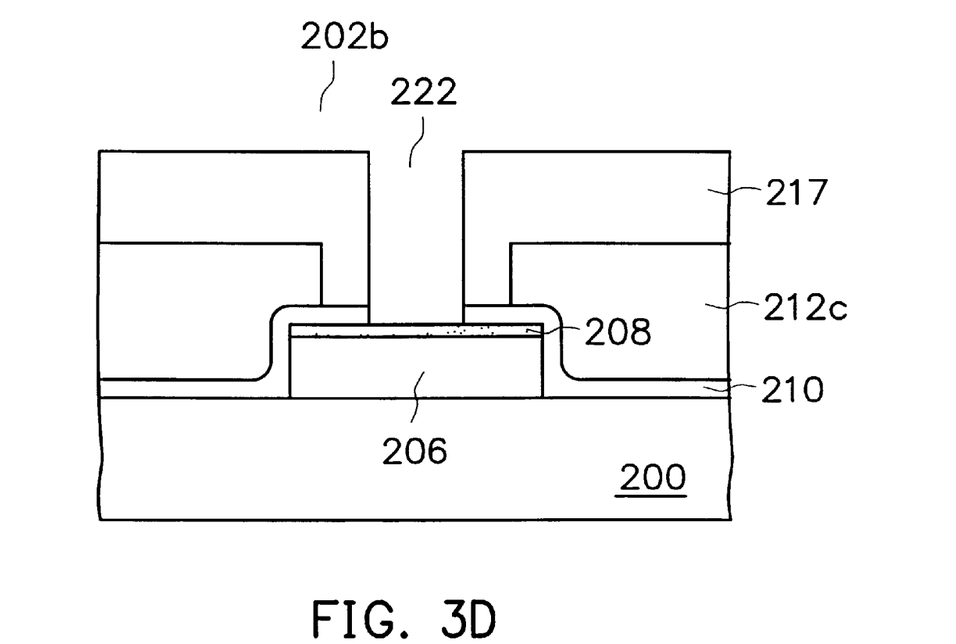

An IMD layer 217 is then formed on the insulating material layer 212c to cover the opening 216a, as shown in FIG. 3C. The IMD layer 217 and the linear dielectric layer 210 are patterned to form a landed via opening 222, as illustrated in FIG. 3D. The unlanded via opening 218a and the landed via opening 220 in FIG. 2H and the landed via opening 222 as formed in FIG. 3A–3D are filled with a conductive material to form a landed via or an unlanded via.

The embodiment of the invention provides a conformal liner dielectric layer on the metal pattern, such that the liner dielectric layer adjacent to the metal layer is thicker. Additionally, the gaps between the metal layers are filled with the insulating material layer filled, so that the thickness of the protective layer on the insulating material layer is larger than that on the metal layer. Accordingly, the formation of the thicker liner dielectric layer and the protective layer can prevent over-etching.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an unlanded via adapted for use on a substrate having a metal layer formed thereon, the metal layer having an anti-reflective-coating (ARC) layer thereon, the method comprising:

forming a liner dielectric layer on the ARC layer and a sidewall of the metal layer;

forming an insulating material layer on the liner dielectric layer;

etching back the insulating material layer so that a top surface of the insulating material layer is lower than a top surface of the ARC layer;

forming a protective layer on the insulating material layer wherein the protective layer is different from the liner dielectric layer;

forming an IMD layer on the protective layer;

forming an opening in the IMD layer and the protective layer wherein the liner dielectric layer on the sidewall of the metal layer is thicker than that on the metal; and removing the liner dielectric layer on the metal layer to form an unlanded via opening.

2. The method according to claim 1, wherein the insulating material layer includes SOG.

3. The method according to claim 1, wherein the protective layer includes silicon nitride.

4. The method according to claim 1, wherein after the step of forming a protective layer further comprises the step of planarizing the protective layer.

5. The method according to claim 1, wherein the protective layer is planarized by CMP.

6. The method according to claim 1, wherein the step of forming an unlanded via opening in the IMD layer and the protective layer further comprises the step of removing the liner dielectric layer on the ARC layer.

7. The method according to claim 1, wherein the thickness of the ARC layer is in a range of about 500–1000 angstroms.

8. The method according to claim 1, wherein the liner dielectric layer includes silicon oxide.

9. The method according to claim 1, wherein the liner dielectric layer is about 2000 angstroms thick.

10. A method of fabricating an unlanded via adapted on a substrate having a plurality of wiring lines including a wide-type wiring line and a narrow-type wiring line in which the wide-type wiring line is greater in line width than the narrow-type wiring line, the wiring lines having an ARC layer formed thereon and separated by a plurality of gaps, the method comprising:

filling the gaps with an insulating material layer, a top surface of the insulating material layer being lower than a top surface of the ARC layer, wherein a portion of the insulating material layer remains on the wide-type wiring line providing an additional height to the wide-type wiring line wile filling the gapes;

forming a protective layer on the insulating material layer, the protective layer having a height equal to the additional height provided by the insulating material layer on the wide-type wiring line;

forming an IMD layer over the protective layer and the wiring lines on a top topographic surface over the substrate; and forming an unlanded via opening by patterning the IMD layer to expose the ARC layer of the wiring lines, wherein a portion of the protective layer is also exposed but not the insulating material layer.

11. The method according to claim 10, wherein a surface of the protective layer is higher than a surface of the ARC layer.

12. The method according to claim 10, wherein the insulating material layer includes SOG.

13. The method according to claim 10, wherein the protective layer includes silicon nitride.

14. The method according to claim 10, wherein a liner oxide layer is formed between the wiring lines and the insulating material layer.

15. A method of fabricating an unlanded via adapted for use on a substrate having a first metal layer and a second metal layer formed thereon, the first and the second metal layers having an anti-reflective-coating (ARC) layer thereon, comprising:

forming a conformal liner dielectric layer on the substrate, the first and the second metal layer;

forming an insulating material layer on the conformal liner dielectric layer;

at least exposing the conformal dielectric layer on the first metal layer by etching back the insulating material layer wherein a portion of the insulating material layer remains on the second metal layer;

forming a protective layer on the insulating material layer, the first and the second metal layer;

patterning the protective layer and the insulating material layer to form an opening over the second metal layer;

planarizing the protective layer to at least expose the liner dielectric layer on the first metal layer;

forming an IMD layer on the protective layer, the first and the second metal layer; and patterning the IMD layer to form an unlanded via opening on the first metal layer and a landed via opening on the second metal layer.

16. The method according to claim 15, wherein patterning the opening includes exposing a portion of the insulating material layer.

17. The method according to claim 15, wherein patterning the opening includes exposing the liner dielectric layer.

18. The method according to claim 15, wherein the insulating material layer includes SOG.

19. The method according to claim 15, wherein the protective layer includes silicon nitride.

20. The method according to claim 15, wherein the conformal liner dielectric layer includes silicon oxide.

* * * * *